(12) United States Patent
Sobchak et al.

(10) Patent No.: US 7,782,991 B2
(45) Date of Patent: Aug. 24, 2010

(54) FRACTIONALLY RELATED MULTIRATE SIGNAL PROCESSOR AND METHOD

(75) Inventors: Charles LeRoy Sobchak, Davie, FL (US); Mahibur Rahman, Lake Worth, FL (US); Emilio J. Quiroga, Lake Worth, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 898 days.

(21) Appl. No.: 11/621,387

(22) Filed: Jan. 9, 2007

(65) Prior Publication Data

US 2008/0165907 A1 Jul. 10, 2008

(51) Int. Cl.
*H04L 7/00* (2006.01)
*H03D 3/24* (2006.01)

(52) U.S. Cl. .................... 375/355; 375/373
(58) Field of Classification Search ............. 375/355, 375/373, 354, 371
See application file for complete search history.

(56) References Cited

U.S. PATENT DOCUMENTS

| | | | |
|---|---|---|---|
| 6,856,266 B2 * | 2/2005 | Clement et al. ............. | 341/143 |
| 7,039,438 B2 | 5/2006 | Khlat | |
| 7,046,977 B2 | 5/2006 | Khlat et al. | |
| 2001/0031001 A1 | 10/2001 | Gazsi et al. | |
| 2002/0039396 A1 | 4/2002 | Zalio | |
| 2002/0083306 A1 | 6/2002 | Pessolano et al. | |
| 2003/0012288 A1 * | 1/2003 | Zhou ......................... | 375/260 |
| 2003/0052740 A1 | 3/2003 | Salmi et al. | |
| 2003/0065693 A1 | 4/2003 | Nothlings et al. | |
| 2004/0151209 A1 | 8/2004 | Cummings et al. | |
| 2004/0248624 A1 | 12/2004 | Leclercq | |

\* cited by examiner

*Primary Examiner*—David C Payne
*Assistant Examiner*—Brian J Stevens

(57) ABSTRACT

A multirate processing circuit (100) with a resampling filter (106) to accept a sampled input signal (104) sampled with a first clock rate and to filter the sampled input signal to remove spectral components above a spectral bandwidth of a second clock rate. The sampled input signal represents a signal that is more efficiently processed at the second clock rate, which is fractionally related to the first clock rate. The multirate processing circuit (100) also has a discrete time processor (108) that receives the resampling filter output (130) and processes that output at an integer power of two multiple of the first clock rate. The discrete time processor (108) further excludes selected samples from the processing so as to effectively perform discrete time processing of the resampling filter output (130) at the integer power of two multiple of the second clock rate.

20 Claims, 9 Drawing Sheets

| RANGE | ADVANCE/DELAY ADJUSTMENT | p=24, q=25, N=6 (7TAPS) | ADVANCE/DELAY ADJUSTMENT | p=13, q=16, N=7 (8TAPS) | ADVANCE/DELAY ADJUSTMENT |
|---|---|---|---|---|---|
| $mod_q(n-N)<p-N$ | $I=0$ FOR ALL m | $mod_{25}(n-6)<18$ $n<24$ | $I=0$: ALL m | $mod_{25}(n-7)<16$ $n<23$ | $I=0$: ALL m |
| $mod_q(n-N)\geq p-N$ | $I=q-p$ FOR: $m\leq mod_q(n-N)-(p-N)$ $I=0$ FOR OTHER m | $mod_{25}(n-6)>18$ | $I=1$ FOR: $m\leq mod_q(n-6)-18$ $I=0$ FOR OTHER m | $mod_{25}(n-7)>16$ | $I=3$ FOR: $m\leq mod_q(n-7)-16$ $I=0$ FOR OTHER m |
| $mod_q(n-N)<p-\lceil\frac{N}{2}\rceil$ | | $mod_{25}(n-6)<21$ | | $mod_{25}(n-7)<20$ $n=23,24,25,26$ | |
| $mod_q(n-N)\geq p-\lceil\frac{N}{2}\rceil$ | $I=0$ FOR ALL m | $mod_{25}(n-6)\geq 21$ $n=27$ | $I=0$: ALL m | $mod_{25}(n-7)\geq 20$ | $I=0$: ALL m |
| $mod_q(n-N)<q-\lceil\frac{N}{2}\rceil$ | | $mod_{25}(n-6)<22$ | | $mod_{25}(n-7)<22$ $n=27,28$ | |
| $mod_q(n-N)\geq q-\lceil\frac{N}{2}\rceil$ | $I=p-q$ FOR: $m\geq mod_q(n-N)-(p-N)$ $I=0$ FOR OTHER m | $mod_{25}(n-6)\geq 22$ $n=28,29,30$ | $I=-1$ FOR: $m\geq mod_q(n-6)-18$ $I=0$ FOR OTHER m | $mod_{25}(n-7)\geq 22$ $n=29,30,31$ | $I=-3$ FOR: $m\geq mod_q(n-7)-16$ $I=0$ FOR OTHER m |

FRACTIONALLY RELATED MULTIRATE SIGNAL PROCESSOR AND METHOD

BACKGROUND

1. Field

This invention generally relates to digital signal processing circuits, and more particularly to multirate digital processing circuit architectures.

2. Related Art

Discrete time, or digital, signal processing generally performs discrete time processing on data samples representing time sampled analog signals. The data samples accepted by a discrete time signal processor are sampled with a time period that may not be adapted to the frequency spectral content of the analog signal being represented. Some discrete time signal processing algorithms are able to be more efficiently implemented, e.g., by using less memory to implement fewer delay line stages to perform an equivalent processing function, if the discrete time sampling rate is adjusted to more closely match the spectral components of the data being processed.

Adjustment of a sampling rate of a discrete time signal is performed, for example, in multirate discrete time processing systems. Multirate discrete time processing systems generally include processing for resampling the data stream. Conventional resampling generally operates in one of two methods. A first method upsamples and filters a data stream to a much higher sampling rate and then downsamples the filtered signal at the desired processing sampling rate. Another method implements a resampling filter to accept a discrete time data stream at one sampled rate and produces an output data stream that has the desired, and different, sampling rate.

These conventional systems require two reference clocks to control the digital processing hardware, one reference clock that operates at the incoming data sampling rate and another reference clock that operates at the desired sampling rate at which the discrete signal processing is to be performed. If these two reference clock rates are not related by an integer multiple of one another, generation of these two different reference clock signals requires clock generation hardware, which often operates at a high speed and consumes significant current and are often quite costly, to be mostly replicated for each of these two reference clocks. For example, many such applications require two independent Phase Locked Loops (PLLs), each requiring independent Voltage Controlled Oscillators (VCOs) to generate the two reference clocks.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 12 is a table illustrating advance and delay adjustments of the finite impulse response filter processing illustrated in FIGS. 4-11;

DETAILED DESCRIPTION

Figure 1:
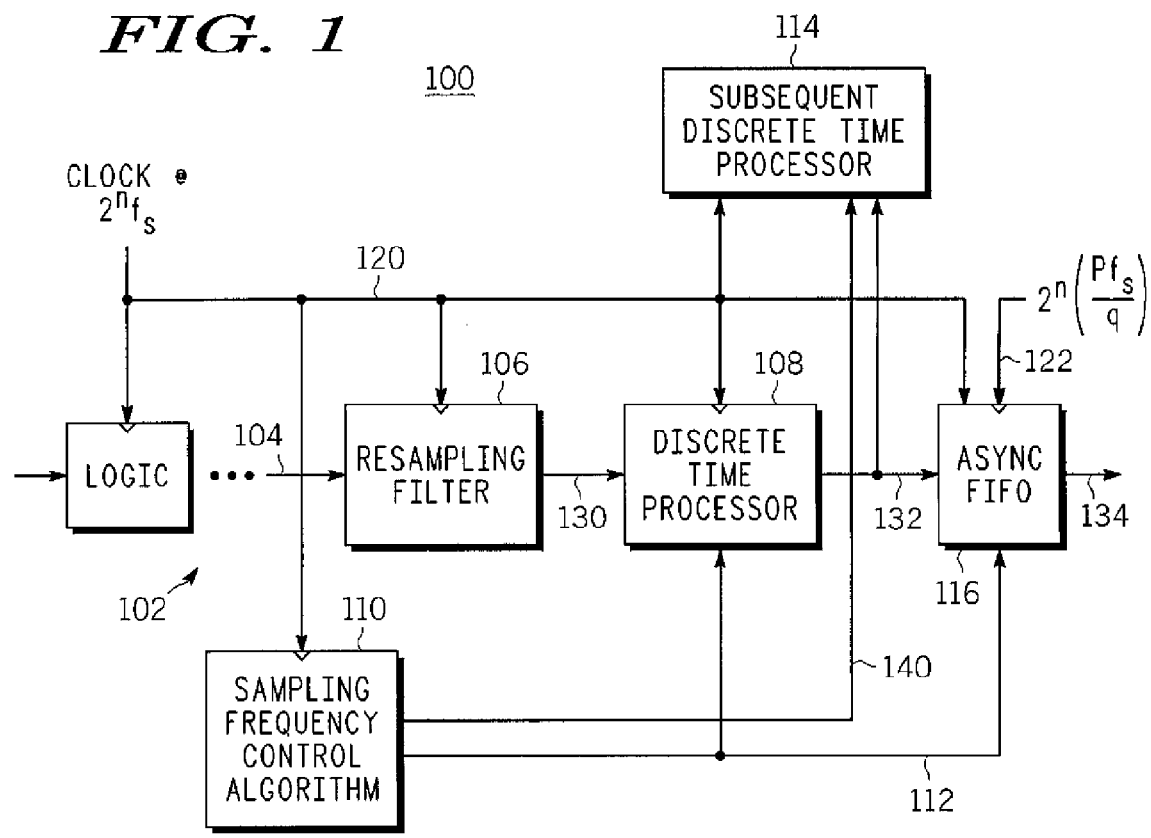
FIG. 1 is a functional block diagram of a multirate processing circuit in accordance with one embodiment of the invention.

FIG. 1 is a functional block diagram of a multirate processing circuit 100 in accordance with one embodiment of the invention. This multirate processing circuit 100 accepts a sampled input signal that is sampled at a first clock rate that is synchronized to a first clock signal 120, which is indicated to have a frequency of $2^n f_s$. Although the first input signal is sampled at the first clock rate, the input signal of this example represents a signal that is more efficiently processed by circuitry operating at a second clock rate. The second clock rate, which is the clock rate at which the processing of the input signal is based, is able to be either higher or lower than the first clock rate.

In one example, the second clock rate has a frequency defined as $2^n (p/q) f_s$. The ratio of the frequency of the first clock to the frequency of the second clock, i.e., p/q in this example, is represented for this embodiment as a ratio of two integers, p and q, respectively, where q is not an integer multiple of p. In this case, the second clock rate is different than and fractionally related to the first clock rate. In one embodiment, the second clock rate is not a multiple of the first clock rate, and the second clock rate is neither a positive integer power of two nor a negative integer power of two, i.e., the second clock rate is not related to the first clock rate by a multiple of $2^n$ or $\frac{1}{2}^n$. In one embodiment, the value of q is greater than the value of p and therefore the second clock rate is less than the first clock rate.

The input signal is conditioned and processed by input circuitry 102 at the first clock rate according to conventional processing techniques. The input circuitry 102 of one embodiment of the present invention performs gain normalization of the input signal to normalize an amplitude of the sampled input signal and allow for a lower bit width signal to be used for subsequent discrete time processing. The input circuitry 102 produces a resampling filter input signal 104 that is sampled at the frequency of the first clock signal 120, i.e., $2^n f_s$, and provided to resampling filter 106. The resampling filter 106 of this embodiment filters the resampling filter input signal 104 to remove spectral components above a spectral bandwidth of the second clock rate $2^n (p/q) f_s$, to produce a band limited sampled signal 130 that is sampled at the first clock rate $2^n f_s$. Further embodiments of the present invention are able to produce band limited sampled signals 130 that are sampled at integer multiples of two of the first clock rate. Producing such upsampled outputs allow flexibility in the design of and algorithms used in the resampling filter 106.

The band limited sampled signal 130 is provided to a discrete time processor 108, which processes the band limited sampled signal 130 with adapted Digital Signal Processing (DSP) algorithms. The adapted DSP algorithms are performed in this embodiment by the discrete time processor 108 that processes samples of the band limited sampled signal 130 at either an integer power of two multiple of the first clock rate or at the first clock rate itself. It is to be noted that the discrete time signals described herein are able to be represented by data streams sampled at integer powers of two of their original clock rate. Some embodiments of the present invention are able to represent signals with clock rates that are multiplied by "two" raised to either zero, positive or negative integer powers. One embodiment accepts the band limited sampled signal 130 at the first clock rate, which is two raised to the zero power times the first clock rate. In one embodiment, the adapted DSP algorithms implemented by the discrete time processor 108 exclude selected samples of the band limited sampled signal 130 from the processing so as to effectively perform discrete time processing of the band limited sampled signal 130 at the integer power of two multiple of the second clock rate. In one embodiment, the second clock rate is selected based upon a periodicity of a signal represented by the resampling filter input signal 104.

The discrete time processor 108 provides a processed sampled signal 132 to a subsequent discrete time processor 114. The subsequent discrete time processor 114 further accepts the first clock signal 120 and the second set of control signals 140 that generated by the sampling frequency control algorithm 110, which are described below. The subsequent discrete time processor 114 receives an output produced by the discrete time processor 108. In this configuration, the discrete time processor 108 includes one or more intermediate processing stages that process the band limited sampled signal 130. The subsequent discrete time processor 114 processes samples produced at the output of the discrete time processor 108 at an integer power of two multiple of the first clock rate and excludes from the processing selected samples so as to effectively perform discrete time processing of the samples produced at the output of the discrete time processor 108 at the integer power of two multiple of the second clock rate.

The discrete time processor 108 provides a processed sampled signal 132 to an asynchronous (ASYNC) First In, First Out buffer (FIFO) 116. The ASYNC FIFO 116 accepts a second clock signal, at the second clock rate $2^n(p/q)f_s$, and extracts the proper samples of the processed sampled signal 130 to create a downsampled output 134 that is sampled at the second clock rate. The ASYNC FIFO 116 of one embodiment receives the first clock signal 120 and a first set of proper control signals 112 from the sampling frequency control algorithm controller 110. The first set of control signals 112 of one embodiment are especially adapted to provide proper timing signals that indicate occurrences of the selected samples that are the samples to be removed, or extracted, from the processed sampled signal 130 by the processing stages receiving the first set of control signals 112 or the second set of control signals 140. The ASYNC FIFO 116, based upon the first clock signal 120 and the first set of control signals 112 generated by the sampling frequency control algorithm controller 110, removes the selected samples from the processed sampled signal 132 to produce a downsampled output signal 134 at an integer power of two multiple of the second clock rate.

A sampling frequency control algorithm controller 110 produces sampling algorithm control synchronization signals, such as the first set of control signals 112 and a second set of control signals 140, that are required by the various discrete time processors, such as the processor implementing the discrete time processor 108, the subsequent discrete time processor 114, and the ASYNC FIFO 116, to properly remove the selected samples from the signal sampled at the first clock rate, as those samples are present within various stages of each of those processing blocks, to properly represent the signal as effectively sampled at the second clock rate.

As is mentioned above and described in detail below, the discrete time processor 108 operate to effectively process the discrete time signal at the second clock rate even though the processing is performed at the first clock rate. The processing of one embodiment accomplishes this by determining samples of the band limited sampled signal 130 that are to be excluded from processing by the DSP algorithms implemented by the discrete time processor 108 and the sampling frequency control algorithm controller 110 produces synchronization signals, such as the first set of control signals 112 and the second set of control signals 140, that indicate when the selected sample is present in the data stream being processed by the various processing stages within the discrete time processor 108. The sampling algorithm control synchronization signals, such as the first set of control signals 112 and the second set of control signals 140, of one embodiment are adapted to the processing requirements of the individual processing stages, as is described below.

In one embodiment, the first set of control signals 112 are generated based upon the requirements of the processing stage or stages that receive them, such as the discrete time processor 108 and the ASYNC FIFO 116. The subsequent discrete time processor 114 of one embodiment requires different control signals. The sampling frequency control algorithm 110 generates a second set of control signals based 140 based upon the requirements of the subsequent discrete time processor 114.

Figure 2:
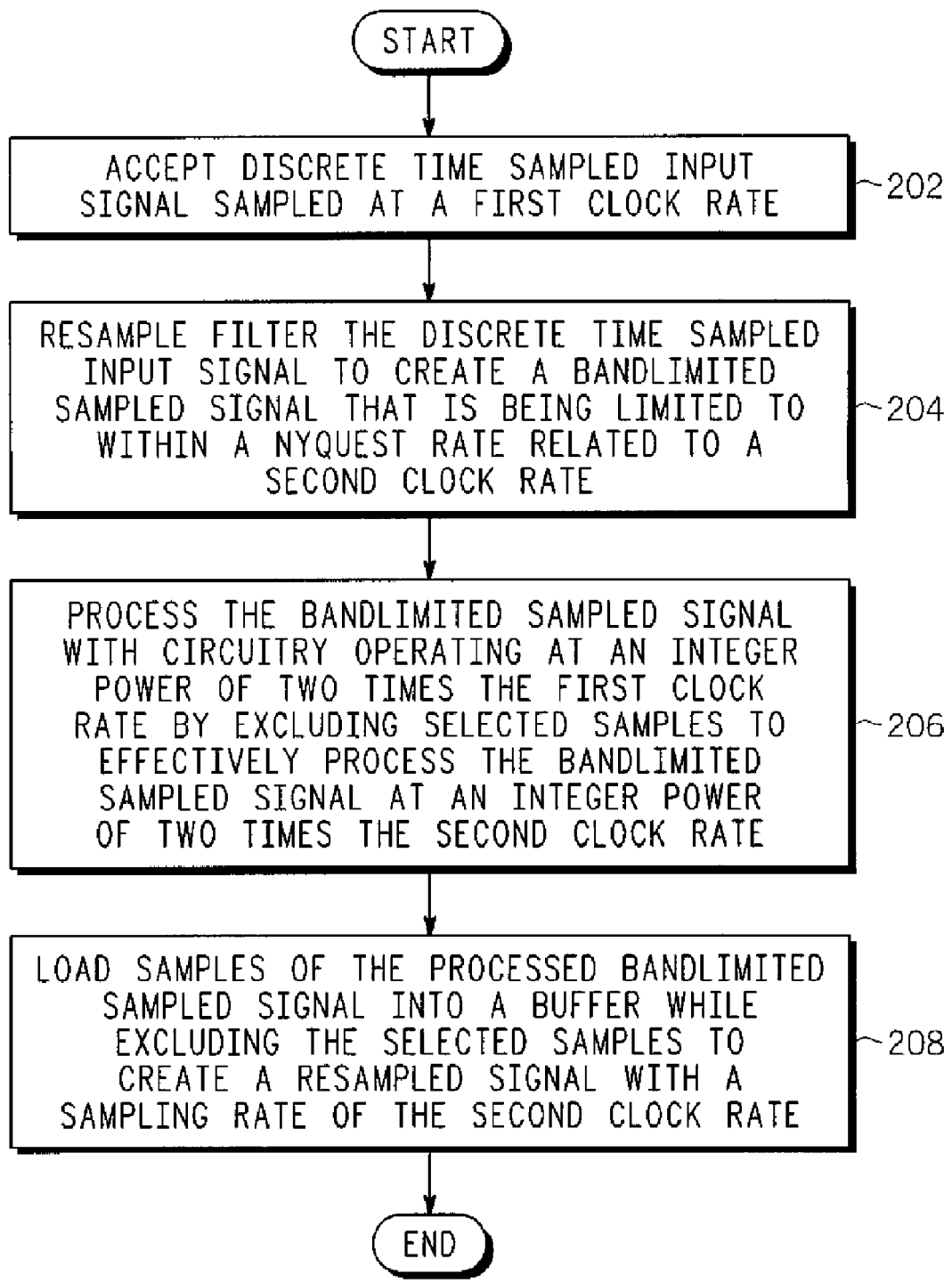
FIG. 2 is a processing flow diagram illustrating multirate discrete time processing in accordance with one embodiment of the invention.

FIG. 2 is a processing flow diagram illustrating multirate discrete time processing 200 in accordance with one embodiment of the invention. The multirate discrete time processing 200 begins by accepting, at step 202, a discrete time sampled input signal that is sampled at a first clock rate. The processing then continues by filtering, at step 204, the discrete time sampled input signal to create a band limited sampled signal with frequency components above a Nyquist rate related to a second clock rate removed therefrom. This resample filtering, for example, band limits the resampling filter input signal 104 to only have frequency components that are below the Nyquist rate for the second clock rate.

The multirate discrete time processing 200 continues by processing, at step 206, the band limited sampled signal with circuitry that operates an integer power of two times the first clock rate. This processing excludes selected samples to effectively process the band limited sampled signal at an integer power of two times the second clock rate. The multirate discrete time processing 200 then continues by loading, at step 208, samples of the processed band limited sampled signal into a buffer while excluding the selected samples to create a resampled signal with a sampling rate of the second clock rate.

Figure 3:
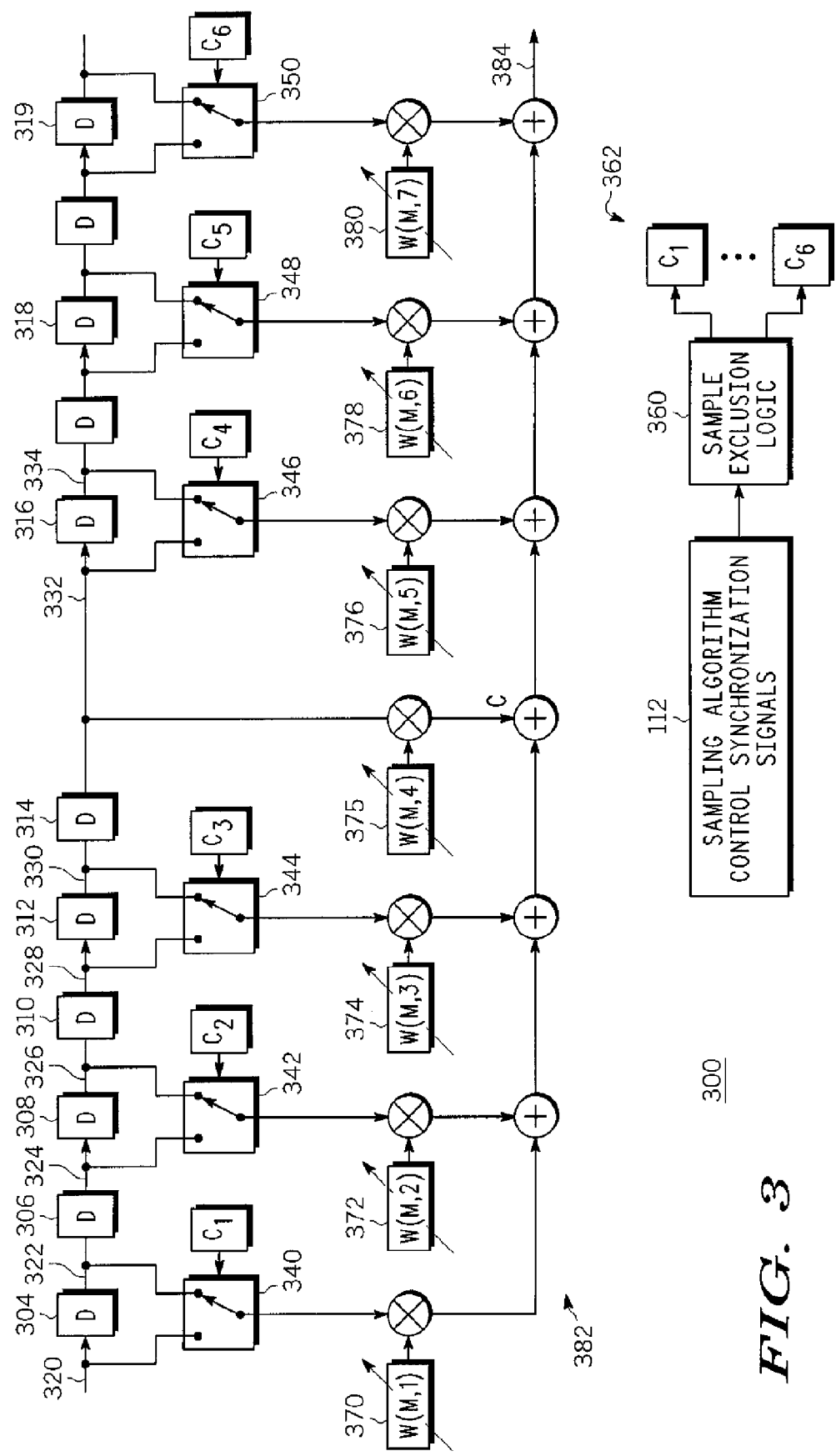
FIG. 3 is a functional block diagram of a discrete time processor that processes sampled signals at a first clock rate by excluding selected samples to effectively process the sampled signal at a second clock rate, in accordance with one embodiment of the invention.

FIG. 3 is a functional block diagram of a discrete time processor 300 that processes sampled signals at a first clock rate by excluding selected samples to effectively process the sampled signal at a second clock rate, in accordance with one embodiment of the invention. The discrete time processor 300 corresponds to the discrete time processor 108 described above. The discrete time processor 300 of one embodiment implements a Finite Impulse Response (FIR) filter that includes an eleven stage delay line 302. The eleven stage delay line 302 includes a first delay element 304, a second delay element 306, a third delay element 308, a fourth delay element 310, a fifth delay element 312, and a sixth delay element 314. The sixth delay element of this embodiment produces the "center tap" output for the FIR filtering. The eleven element delay line 302 includes five delay elements after the center tap delay element 314, including a seventh delay element 316.

The discrete time processor 300 includes sample exclusion logic 360 that accepts sampling algorithm control synchronization signals 112 produced by the sampling frequency control algorithm 110. The sampling algorithm control synchronization signals 112 indicate, for example, when to exclude selected samples from the discrete time processing. The discrete time processor 300 of one embodiment excludes selected samples of the discrete time signal data stream as part of the multirate processing implemented by the discrete time processor 300. The sample exclusion logic 360 generates a number of tap selection control signals 362 to control which data samples are included in the processing of the discrete time processor 300. The illustrated embodiment generates six tap selection control signals 362, indicated as C1 through C6, that control exclusion of selected samples from the summation of the FIR filter implemented by the illustrated embodiment.

The selected taps of the eleven tap delay line 302 of the illustrated embodiment have a corresponding tap selector to allow selection of the data sample that is either before or after the delay element associated with that tap selector. For example, the first delay element 304 has a first tap selector 340 that allows selection of either the first delay element input 320 or the first delay element output 322 based upon the value of the C1 control signal. The third delay element similarly has a second tap selector 342 that allows selection of either the third delay element input 324 or the third delay element output 326 based upon the value of the C2 control signal. The third delay element similarly has a second tap selector 342 that allows selection of either the third delay element input 324 or the third delay element output 326 based upon the value of the C2 control signal. The fifth delay element input 328 and the fifth delay element output 330 are selected by a third tap selector 342 based upon the value of the C3 control signal. The delay elements after the center tap value produced as an output of the sixth delay element 314 are similarly selected by a fourth tap selector 346 based upon the value of the C4 control signal. A fifth tap selector 348 selects between an input and an output of the ninth delay element 318 based upon the value of the C5 control signal, and a sixth tap selector 350 selects between an input and an output of the eleventh delay element 319 based upon the value of the C6 control signal. Proper switching of the tap selectors, based upon the control signals 362, allows selecting delay line tap outputs so that a selected sample is excluded from the FIR filter output for all samples except for the sample where the selected sample is being produced by the center tap 332. In that case, the FIR filter output for that sample is to be discarded by subsequent processing.

The output of each tap selector is provided to a corresponding tap weighting multiplier. The first tap selector 340 is provided to a first tap weight multiplier 370, the second tap selector 342 is provided to a second tap weight multiplier 372, the third tap selector 344 is provided to a third tap weight multiplier 374, the fourth tap selector 346 is provided to a fifth tap weight multiplier 376, the fifth tap selector 348 is provided to a sixth tap weight multiplier 378, and the sixth tap selector 350 is provided to a seventh tap weight multiplier 380. The center tap 332 of one embodiment is provided to a center tap multiplier 375. Alternative embodiments of the present invention are able to not include a center tap multiplier and incorporate a normalized center tap weight of one such that the center tap is added directly into the discrete time processor output 384.

Each of the tap weight multipliers of one embodiment is able to have variable weights based upon the sample count currently being processed. For example, the first tap weight multiplier 370 has a weight indicated by w(m,1), where "m" indicates the current sample count for the discrete time processor 300 processing and the "1" indicates that this is the weight for the first tap. Other tap weights have similarly identified values. One embodiment of the present invention implements the tap weight multipliers by a look-up table, as is known to ordinary practitioners in the relevant arts in light of the present discussion. The output of each tap weight multiplier is provided to a summer 382 to sum these values to produce a discrete time processor output 384 value. The operation of the tap selectors, as outlined above and described in detail below, selectively withhold, in response to the synchronization signals, providing at least one delay line tap output to the summer.

FIGS. 4-7 illustrate finite impulse response filter processing performed by the discrete time processor of FIG. 3; in accordance with one embodiment of the present invention. A data stream 402 is shown to contain an ordered series of data samples that represent a discrete time signal to be processed by a discrete time processor. FIGS. 4-7 represent a discrete time processor by a seven (7) tap delay line which represents seven data samples to be processed (e.g., weighted and summed for an FIR filter). The seven tap delay line of FIGS. 4-7 incorporate the tap selection switching described above and allow variations in the data samples that are selected, and also excluded, from the discrete time processing. FIGS. 4-7 illustrate discrete time processing where sample x[24] 406 of data stream 402 is to be excluded such that one sample of every 25 of an input data stream sampled at a first clock rate is excluded from processing in order to implement a 24/25 data clock resampling ratio.

Figure 4:
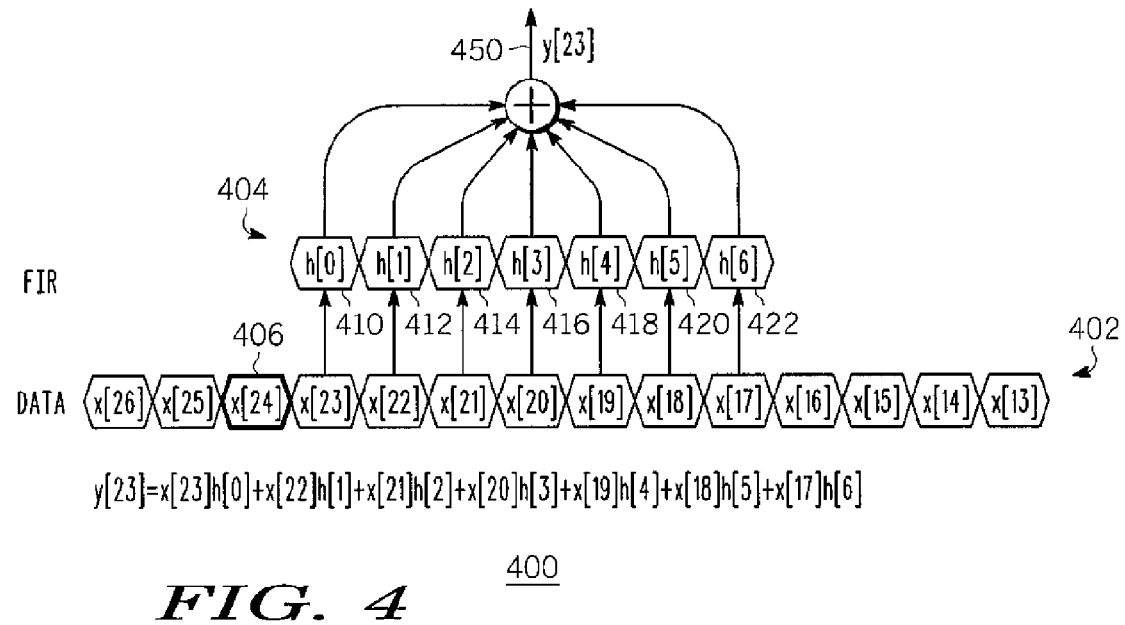
FIGS. 4-7 illustrate finite impulse response filter processing performed by the discrete time processor of FIG. 3.

FIG. 4 illustrates a first time value status 400 data stream 402 and first time value delay line tap values for a seven (7) tap delay line used by a discrete time processor, such as an FIR filter. The first time value status 400 shows that the first time value delay line tap values 404 contain data samples x[23] through x[17], respectively. This reflects that the time samples numbered 17 through 23 have been shifted into the seven tap delay line. These delay line tap values are weighted and summed to produce an output 450. In the state of the first time value status 400, the data sample to be excluded is not within the delay line structure 404 and therefore the delay line tap values 404 do not exclude any samples that would be normally processed by a conventional FIR filter.

Figure 5:
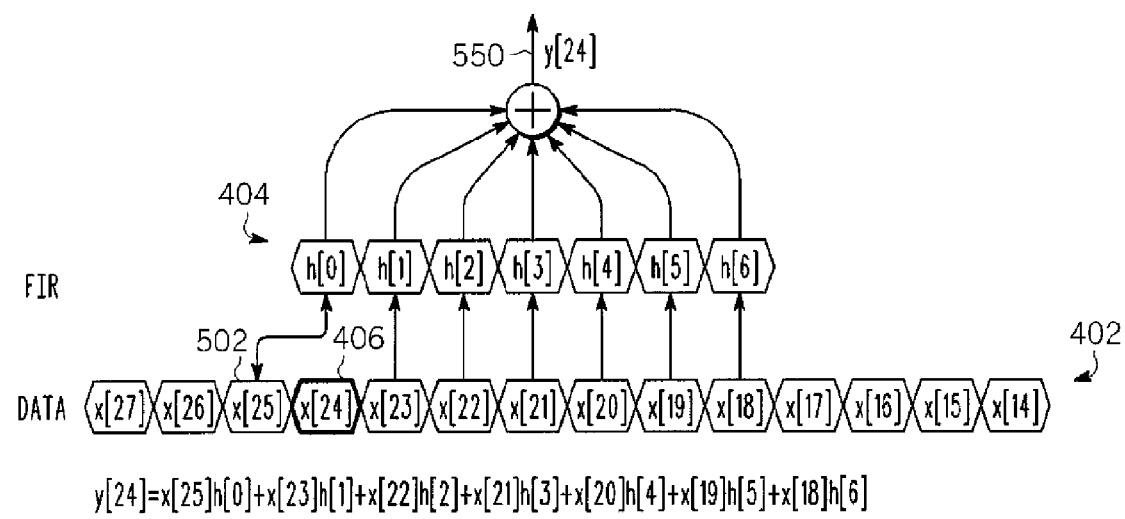

FIG. 5 illustrates a second time value status 500 where the x[24] data sample 406, i.e., the selected data sample, is within the delay line 404. The h[0] 410 tap of the delay line 404 has been switched to include the x[25] data sample 502 instead of the x[24] data sample 406 in the summation to produce output 550. The x[25] data sample 502 is selected in one embodiment by commanding a first tap selector, which would be equivalent to the first tap selector 340 described above, to switch from selecting a first delay element output, such as the first delay element output 322 described above, to selecting the first delay element input, similar to the first delay element input 320 described above, after the x[24] data element 406 has been shifted into the first delay element 304. This results in selecting the x[25] data element 502 as the first tap output for inclusion into processing and exclusion of the x[24] data element 406 from processing. The other delay line taps, i.e., delay line tap h[1] 412 through delay line tap h[6] 422, produce the data samples as would be expected for conventional processing.

Figure 6:
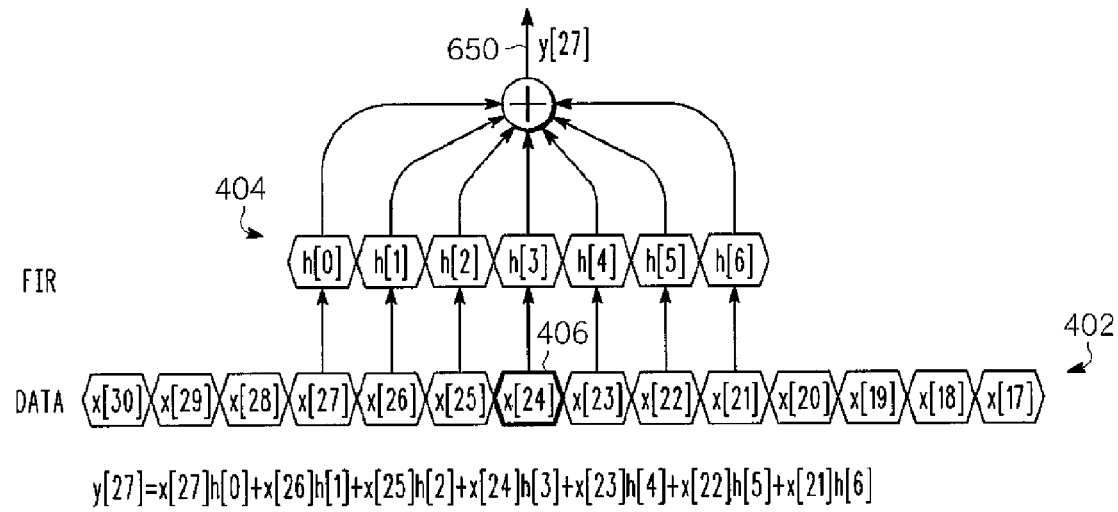

FIG. 6 illustrates a third time value status 600 where the x[24] data sample 406, i.e., the selected data sample, is located at the center tap h[3] 416. In this example, the seven consecutive samples h[27] through h[21] have been shifted into the delay line 404 and all of these consecutive samples are included in the processing and summed to produce the third time value output 650.

Figure 7:
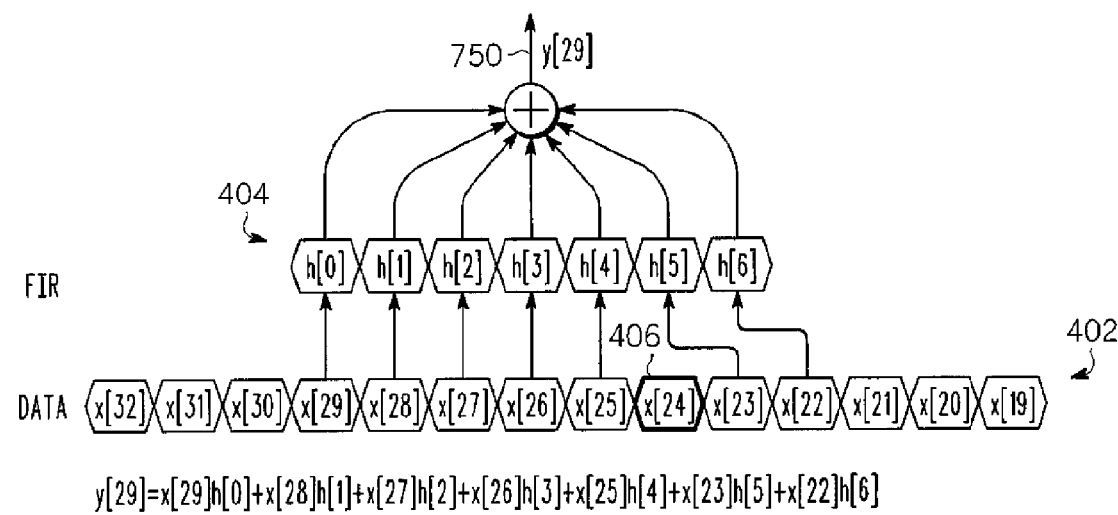

FIG. 7 illustrates a fourth time value status 500 where the x[24] data sample 406, i.e., the selected data sample, has been shifted past the center tap h[3] 416. At the fourth time value, the h[5] tap 420 is configured to select the x[23] data sample and the h[6] tap 422 is configured to select the x[22] data sample. By analogy to the discrete time processor 300, such a configuration is accomplished by having fifth tap selector 348 switched from selecting output of the ninth delay element 318 to selecting the input of the ninth delay element when the x[24] sample has been shifted into the ninth delay element. This configuration causes the selected sample, the x[24] sample 406 in this illustration, to be excluded from processing and not summed into the fourth time value output 750.

A general representation of processing adapted to exclude one or more selected samples from processing is an FIR filter that has N+1 taps and is configured to perform multirate processing on a data stream such that the effective sampling rate has a relationship of (p/q)*(the input clock rate).

The following equations provide a closed form mathematical solution for operating an FIR filter that accepts a discrete time data stream at a first clock rate, operates at the first clock rate while effectively performing discrete time processing of the accepted discrete time data stream at the second clock rate. In the following equations, the weighted tap outputs are indicated by "h[n]" and the filter has N+1 taps. The second clock rate is defined as (p/q)* (the rate of the input sample clock). In one embodiment, the number of taps is related to the value of "q" by (N+1<q). The output of the FIR filter for a particular sample time "n" is indicated by y[n] and is defined as follows:

$$y[n] = \sum_{m=0}^{N} x[n - m + l]h[m]$$

In order to perform the desired processing, one embodiment of the present invention excludes a number of consecutive samples to effectively adjust "p" samples of the input to "q" samples that are to be included in the processing to produce an output. The number of samples to be excluded, which is an advance/delay adjustment for samples being processed, is represented as "l" in the following equations. A negative value of "l" indicates that the samples are to be delayed and a positive value indicates that the samples are to be advanced. The samples to be excluded are referred to as "selected samples." The processing of, for example, an FIR filter is only required to specially modify processing when these selected samples are present in the delay line of the FIR filter.

If the selected samples have not yet entered the FIR filter delay line:

$$\mathrm{mod}_q(n-N) < p-N$$

$$l = 0$$

In the case of the selected samples having entered the FIR filter delay line but are before the center tap, which corresponds to the illustration of FIG. 5, the processing is characterized as:

$$\mathrm{mod}_q(n-N) \geq p-N$$

The advance/delay adjustment is provided by:

$$l = q-p$$

for the filter taps corresponding to tap number "m" that satisfies the following inequality:

$$m \leq \mathrm{mod}_q(n-N) - (p-N)$$

The advance/delay adjustment value for other values of m is zero.

In the case where the selected samples are at the center tap, which corresponds to the illustration of FIG. 6:

$$\mathrm{mod}_q(n-N) \geq p - \left\lfloor \frac{N}{2} \right\rfloor$$

$$\mathrm{mod}_q(n-N) < q - \left\lfloor \frac{N}{2} \right\rfloor$$

The advance/delay adjustment is given by:

$$l = 0$$

In the case of the selected samples being in the FIR filter delay line and past the center tap, which corresponds to the illustration of FIG. 7:

$$\mathrm{mod}_q(n-N) \geq q - \left\lfloor \frac{N}{2} \right\rfloor$$

The advance/delay adjustment is given by:

$$l = p-q$$

for filter taps, m, as follows:

$$m \geq \mathrm{mod}_q(n-N) - (p-N)$$

The advance/delay adjustment value for other values of m is zero.

So the output y[n] will be a properly filtered version of the input discrete time signal x[n] with (q−p) unwanted samples. Processing of the output of this FIR filter will either remove or be adapted to accommodate these (q−p) unwanted samples.

FIGS. 8-11 illustrate finite impulse response filter processing of an alternative discrete time processor in accordance with another embodiment of the present invention. The processing of this alternative discrete time processor is similar to that illustrated above with regards to FIGS. 4-7 with the exception that three consecutive selected samples are excluded from processing for every 16 samples of data stream 802. This alternative discrete time processor therefore provides a clock rate adjustment of (13/16). This alternative discrete time processor has an eight (8) tap delay line which represents eight data samples to be processed (e.g., weighted and summed for an FIR filter). The even number of taps results in having an equivalent of two "center taps" that result in the specialized center tap processing described above. The eight tap delay line of FIGS. 8-11 incorporate the tap selection switching that allows excluding the three consecutive selected samples from the discrete time processing. FIGS. 8-11 illustrate discrete time processing where the x[15] through x[13] data samples 806 of data stream 802 are to be excluded such that three samples of every 16 of an input data stream sampled at a first clock rate are excluded from processing in order to implement the 13/16 data clock resampling ratio.

Figure 8:
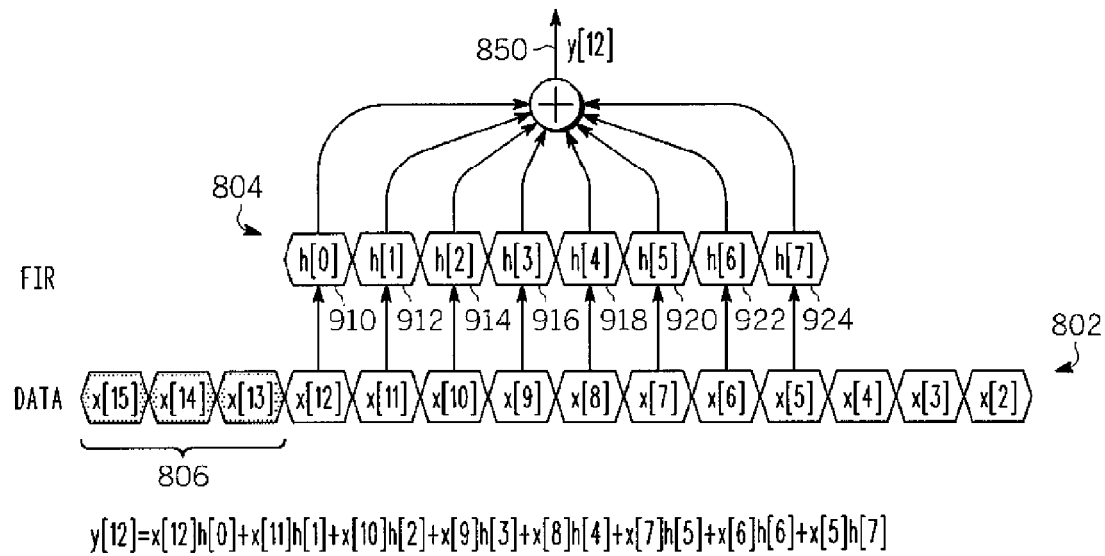
FIGS. 8-11 illustrate finite impulse response filter processing of an alternative discrete time processor in accordance with another embodiment of the present invention.

FIG. 8 illustrates a alternative first time value status 800 data stream 802 and alternative first time value delay line tap values for an eight (8) tap delay line used by a discrete time processor, such as an FIR filter. The alternative first time value status 800 shows that the alternative first time value delay line tap values 804 contain data samples x[12] through x[5], respectively. This reflects that the time samples numbered 5 through 12 have been shifted into the eight tap delay line. These delay line tap values are weighted and summed to produce an output 850. In the state of the alternative first time value status 800, the data samples to be excluded are not within the delay line structure 804 and therefore the delay line tap values 804 do not exclude any samples that would be normally processed by a conventional FIR filter.

Figure 9:
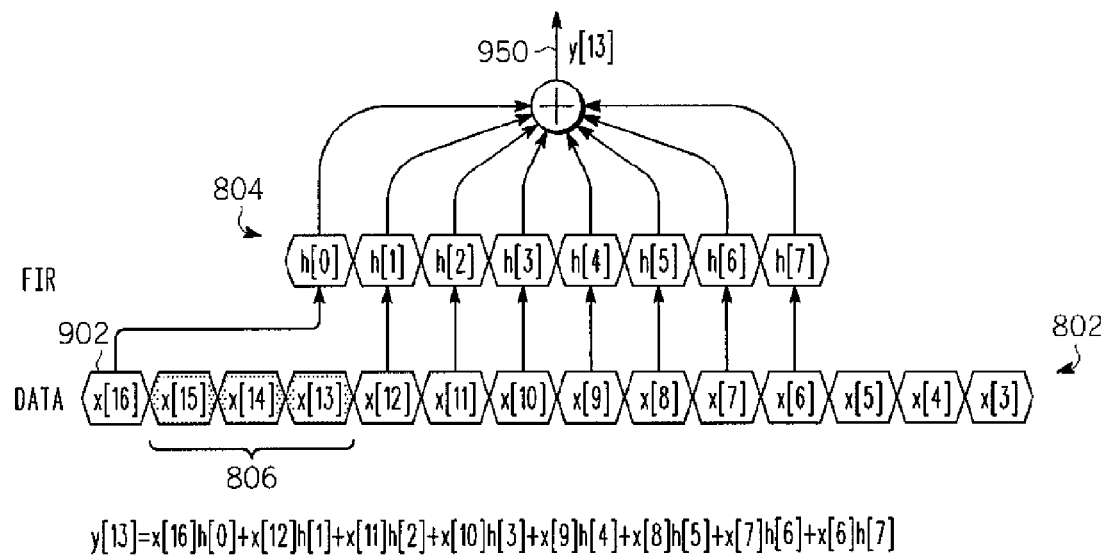

FIG. 9 illustrates an alternative second time value status 900 where the x[15] through x[13] data samples 806, i.e., the selected data samples, are at least partially within the delay line 804. The h[0] 410 tap of the delay line 404 has been switched to include the x[16] data sample 902 instead of any of the selected data samples, i.e., the x[15] through x[13] data samples 806, in the summation to produce output 950. The x[16] data sample 902 is selected in one embodiment by suitably configuring tap selectors to process data in a delay line of the alternative discrete time processor. The other delay line taps, i.e., delay line tap h[1] 912 through delay line tap h[7] 924, produce the data samples as would be expected for conventional processing.

Figure 10:
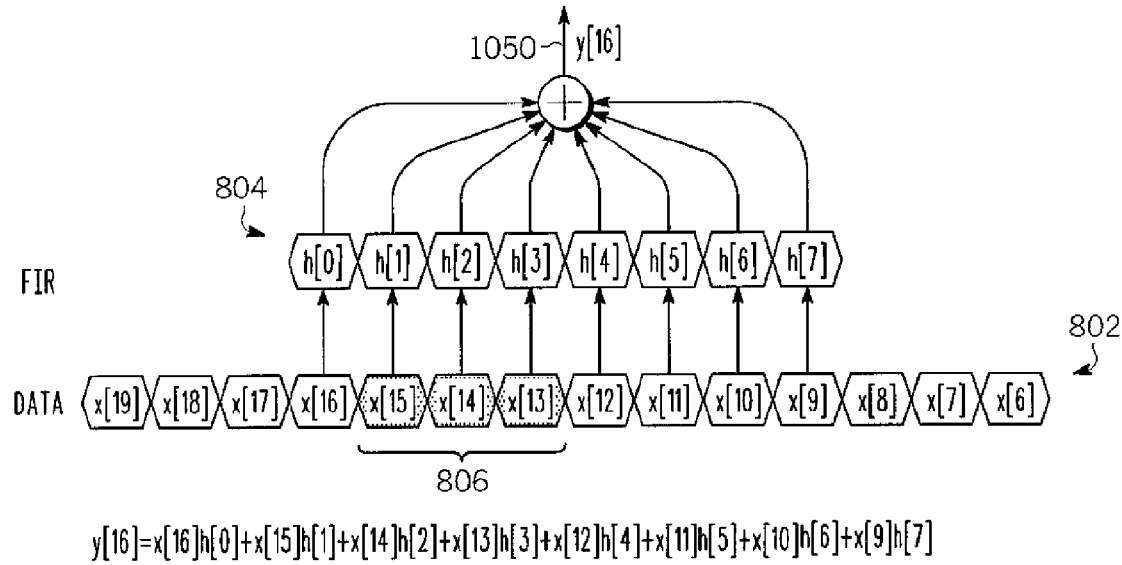

FIG. 10 illustrates an alternative third time value status 1000 where at least one of the selected data samples 806 is located at the center tap h[4] 416. In this example, the eight consecutive samples h[16] through h[9] have been shifted into the delay line 804 and all of these consecutive samples are included in the processing and summed to produce the third time value output 1050.

Figure 11:
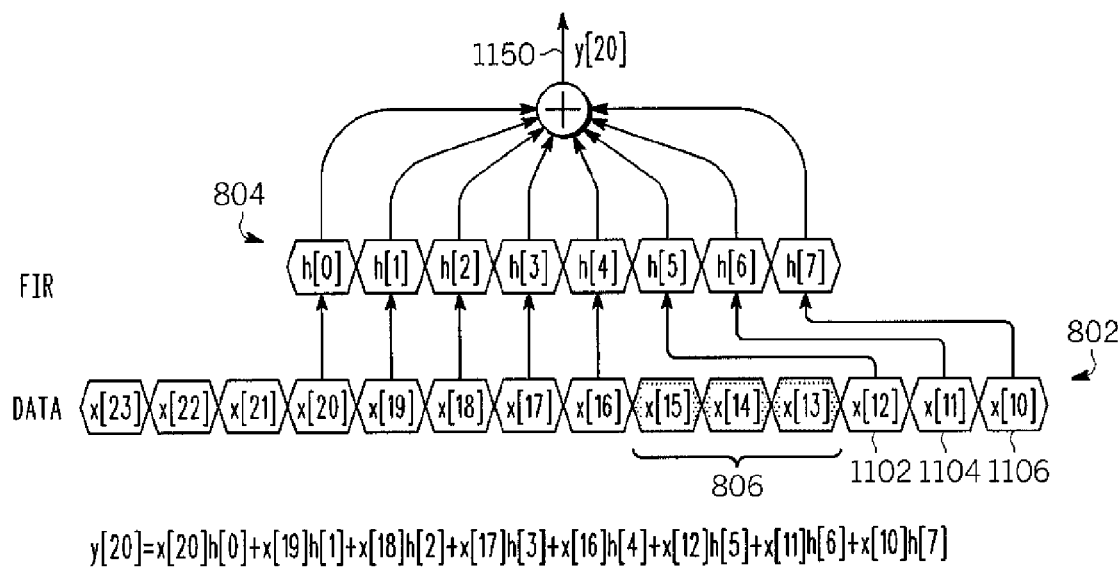

FIG. 11 illustrates an alternative fourth time value status 1100 where the selected data sample 806 have been shifted past the center taps h[3] 816 and h[4] 818. At the alternative fourth time value, the taps of the delay line 804 that would normally produce the selected samples are instead delayed so as to produce the three samples that precedes the selected samples. In this illustration, the h[5] tap 820 is configured to select the x[12] data sample, the h[6] tap 822 is configured to select the x[11] data sample and the h[7] tap is configured to select the x[10] sample. This configuration causes the selected samples 806 to be excluded from processing and not summed into the fourth time value output 1150.

FIG. 12 is a table illustrating advance and delay adjustments of the finite impulse response filter processing 1200 illustrated in FIGS. 4-11. The advance and delay adjustment table 1200 illustrate evaluation of the above described generalized equations for an FIR filter implemented by the discrete time processor depicted in FIGS. 4-7 and an alternative FIR filter implemented by the alternative discrete time processor depicted in FIGS. 8-11.

The advance and delay adjustment table 1200 includes a "range" column 1202 that reflects the sample number of the discrete time signal being processed by a discrete signal processor. A generalized advance/delay adjustment column 1204 indicates the equation to determine the advance/delay adjustment value "l" for a general case.

The advance and delay adjustment table 1200 includes a first parameter column 1206 that indicates the values of parameters of interest for the generalized equations with respect to the discrete signal processor depicted in FIGS. 4-7.

A first advance/delay adjustment column 1208 indicates the particular advance/delay value "l" to be applied to this discrete signal processor and the taps for which that advance/delay value is to be applied (i.e., the delay line elements that are to be excluded from processing). The advance and delay adjustment table 1200 also includes a second parameter column 1210 that indicates the values of parameters of interest for the generalized equations with respect to the alternative discrete signal processor depicted in FIGS. 8-11. A second advance/delay adjustment column 1212 indicates the particular advance/delay value "l" to be applied to the alternative discrete signal processor and the taps for which that advance/delay value is to be applied (i.e., the delay line elements that are to be excluded from processing).

Figure 13:
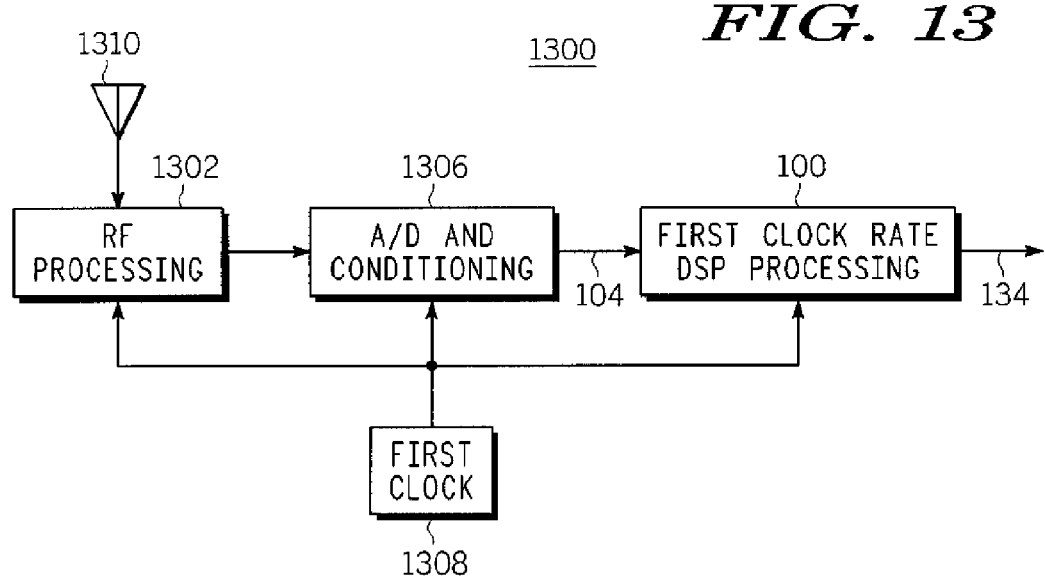
FIG. 13 illustrates an RF receiver incorporating digital signal processing in accordance with one embodiment of the present invention.

FIG. 13 illustrates an RF receiver 1300 incorporating digital signal processing in accordance with one embodiment of the present invention. The RF receiver 1300 is able to be incorporated into, for example, a cellular telephone or other RF communications apparatus. The RF receiver 1300 is also able to be integrated with an RF transmitter to form an RF transceiver.

An RF antenna 1310 receives RF energy and provides received RF energy to an RF processing circuit 1302. The RF processing circuit 1302 receives a clock reference from a first clock circuit 1308 that generates timing signals based upon a first clock rate. The RF processing circuit 1302 provides a downconverted and processed analog signal representing a received RF signal to the Analog to Digital converter (A/D) and conditioning circuit 1306. The A/D and conditioning circuit 1306 also accepts timing signals from the first clock circuit 1308 and produces a sampled discrete time signal 104 that is sampled at the first clock rate. The sampled discrete time signal is accepted by the first clock rate DSP processing circuit 100, which corresponds to the multirate processing circuit 100 described above. The first clock rate DSP processing circuit 100 accepts timing signals from the first clock circuit 1308 and produces a discrete time signal 134 that is sampled at the second clock rate.

An RF receiver 1300 of one embodiment receives an RF signal that contains a digitally modulated communications signal. In that embodiment, the second clock rate for the DSP processing circuit is an integer multiple of a symbol rate, such as a direct sequence spread spectrum chip rate or a data carrying symbol rate, of the digitally modulated communications signal.

In one embodiment, the second clock rate is related to the first clock rate by a ratio of p/q, where p is not equal to q. One embodiment operates by having setting the value of p to 24 and the value of q to 25, to achieve a fractionally related ratio between the first clock rate and the second clock rate of 24/25.

In one embodiment, the first clock rate DSP processing circuit 100 is able to process two categories of discrete time signals. One category of discrete time signals processed by the first clock rate DSP processing circuit 100 includes signals that are more efficiently processed with a sampled clock rate that is based upon 16 MHz. In this context, a clock rate based on 16 MHz includes any clock rate that corresponds to 16 megahertz times two raised to any integer power, where the integer power is able to be positive, negative or zero. A second category of discrete time signals processed by the first clock rate DSP processing circuit 100 includes signals that are more efficiently processed with a sampled clock rate that is based upon 15.36 MHz. As described above, a clock rate based on 15.36 MHz includes any clock rate that corresponds to 15.36 megahertz times two raised to any integer power, where the integer power is able to be positive, negative or zero.

Figure 14:
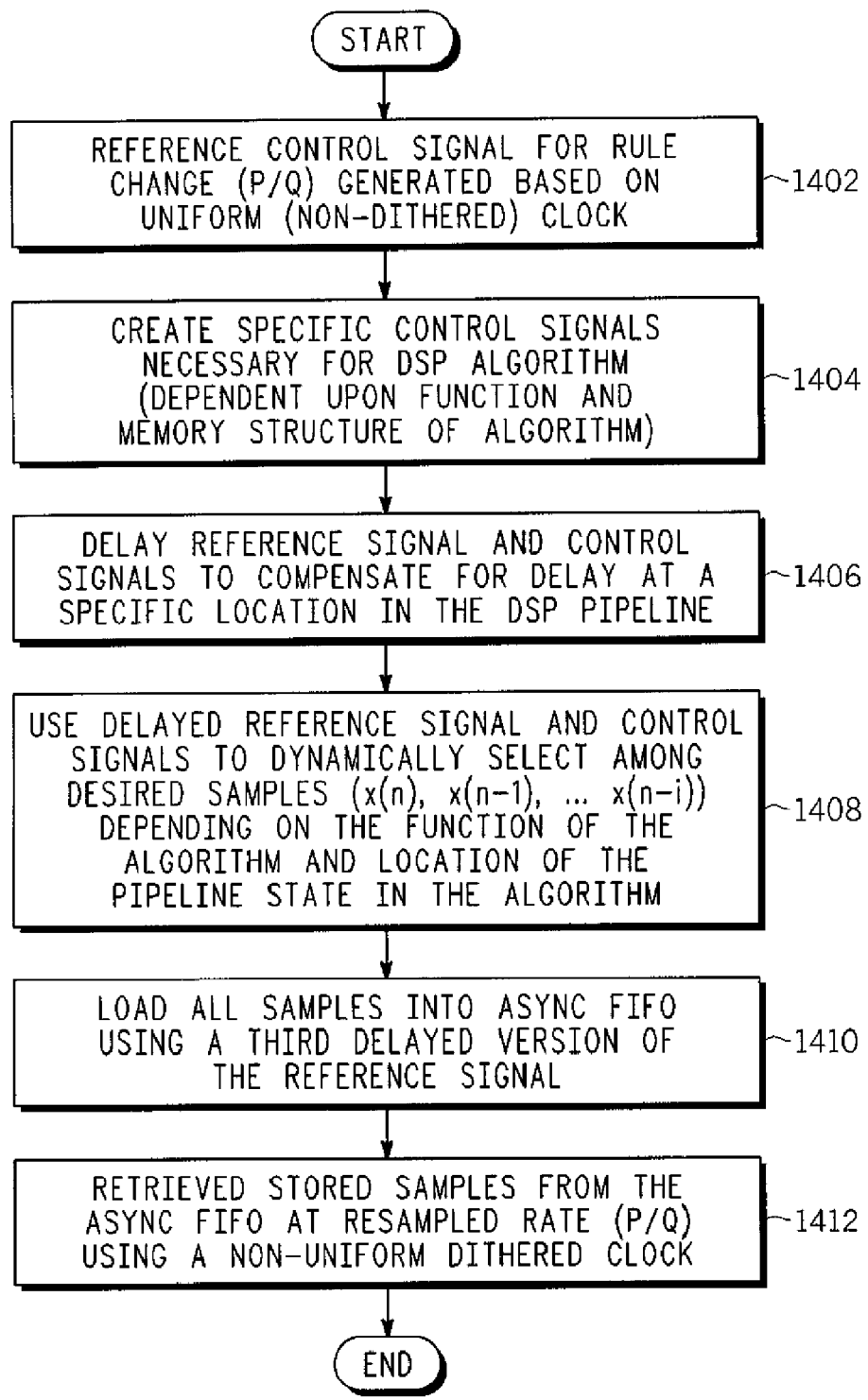
FIG. 14 illustrates a multirate control signal generation processing flow diagram in accordance with one embodiment of the present invention.

FIG. 14 illustrates a multirate control signal generation processing flow diagram 1400 in accordance with one embodiment of the present invention. The multirate signal processing flow 1400 begins by generating, at step 1402, a reference control signal for a rate change, specified by the ratio p/q, the reference control signal being generated based on a uniform, i.e., non-dithered, clock. The generated reference control signals are used to control the particularized multirate processing of the Digital Signal Processing (DSP) being implemented. The multirate signal processing flow 1400 continues by creating, at step 1404, specific control signals necessary for the multirate DSP algorithm of the particular embodiment. These specific control signals are dependent upon the function and memory structure of the particular algorithm being implemented.

The multirate signal processing flow 1400 continues by delaying, at step 1406, the reference signal and control signals to compensate for sample delays introduced by the various stages of the DSP pipeline. For example, one embodiment produces control signals that indicate, for each relevant stage of the DSP pipeline, when the data sample that is to be excluded from processing is present or when special processing is to be implemented by that particular DSP pipeline stage.

The multirate signal processing flow 1400 continues by using, at step 1408, delayed reference signal and control signals to dynamically select among desired samples, e.g., (x(n), x(n−1), . . . x(n−i)) depending on the function of the algorithm and location of the pipeline sate in the algorithm. The multirate signal processing flow 1400 then loads, at step 1410, all samples into an asynchronous first in first out (ASYNC FIFO) circuit using a third delayed version of the reference signal. The multirate signal processing flow 1400 retrieves, at step 1412, stored samples from the ASYNC FIFO at the resampled rate (P/Q) using a non-uniform dithered clock. These samples that are provided at the resampled rate may have limited usability for digital signal processing.

Although the invention is described herein with reference to specific embodiments, various modifications and changes can be made without departing from the scope of the present invention as set forth in the claims below. For example, further embodiments are able to be realized using programmable logic or reprogrammable processors. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multirate processing circuit, comprising
   a resampling filter accepting a sampled input signal sampled with a first clock rate, wherein the multirate processing circuit uses less memory to implement fewer delay line stages when the input signal is processed by circuitry operating at a second clock rate than when the input signal is processed by circuitry operating at the first clock rate, the resampling filter filtering the sampled input signal to remove spectral components above a spectral bandwidth of the second clock rate, the resampling filter producing a band limited sampled signal sampled at the first clock rate;
   a discrete time processor operating with a clock rate that is an integer power of two multiple of the first clock rate, the discrete time processor communicatively coupled to the resampling filter to receive the band limited sampled signal, the discrete time processor adapted to process samples of the band limited sampled signal by excluding selected samples of the band limited sampled signal from the processing so as to effectively perform discrete time processing of the band limited sampled signal at the integer power of two multiple of the second clock rate; and
   a subsequent discrete time processor, communicatively coupled to an output of the discrete time processor, the subsequent discrete time processor processing, at an integer power of two multiple of the first clock rate, samples produced at the output of the discrete time processor, the subsequent discrete time processor further excluding from the processing selected samples so as to effectively perform discrete time processing of the samples produced at the output of the discrete time processor at the integer power of two multiple of the second clock rate.

2. The multirate processing circuit of claim 1, wherein the second clock rate is not a multiple of the first clock rate and wherein the second clock rate is neither a positive integer power of two nor a negative integer power of two.

3. The multirate processing circuit of claim 1, wherein the second clock rate is an integer multiple of a periodicity within the sampled input signal.

4. The multirate processing circuit of claim 3, wherein the sampled input signal comprises a digitally modulated communications signal and wherein the second clock rate is an integer multiple of a symbol rate of the digitally modulated communications signal.

5. The multirate processing circuit of claim 1, further comprising a sampling algorithm controller, communicatively coupled to the resampling filter and the discrete time processor, the sampling algorithm controller adapted to provide synchronization signals indicating occurrences of the selected samples to the resampling filter and the discrete time processor.

6. The multirate processing circuit of claim 5, further comprising an output buffer, communicatively coupled to the resampling filter and the sampling algorithm controller, the output buffer adapted to removing the selected samples from the band limited sampled signal to produce a downsampled output signal at an integer power of two multiple of the second clock rate.

7. The multirate processing circuit of claim 6, wherein the output buffer circuitry is communicatively coupled to the resampling filter through at least one intermediate processing stage.

8. The multirate processing circuit of claim 6, wherein the output buffer circuitry is controlled by a data clock operating at the first clock frequency.

9. The multirate processing circuit of claim 5, wherein the discrete time processor comprises a finite impulse response filter, the finite impulse response filter adapted to exclude, in response to receiving the synchronization signals, the selected samples from the processing performed by the finite impulse response filter.

10. The multirate processing circuit of claim 9, wherein the finite impulse response filter comprises a multiple tap delay line providing a plurality of scaled delay line tap outputs to a summer, the multiple tap delay line adapted to selectively withhold, in response to the synchronization signals, providing at least one delay line tap output to the summer.

11. A method with a multirate processing circuit including a resampling filter and a discrete time processor, for processing discrete time signals, the method comprising:

accepting a sampled input signal sampled with a first clock rate, wherein the multirate processing circuit uses less memory to implement fewer delay line stages when the input signal is processed by circuitry operating at a second clock rate than when the input signal is processed by circuitry operating at the first clock rate;

filtering the sampled input signal to remove spectral components above a spectral bandwidth of the second clock rate to produce a band-limited sampled signal sampled at the first clock rate;

processing, with a clock rate that is an integer power of two multiple of the first clock rate, samples of the band-limited sampled signal while excluding from the processing selected samples of the band-limited sampled signal so as to effectively perform discrete time processing of the band-limited sampled signal at the integer power of two multiple of the second clock rate; and providing synchronization signals indicating occurrences of the selected samples to the resampling filter and the discrete time processor.

12. The method of claim 11, wherein the second clock rate is not related to the first clock rate by a multiple of $2^n$ or $½^n$.

13. The method of claim 11, wherein the second clock rate is an integer multiple of a periodicity within the sampled input signal.

14. The method of claim 13, wherein the sampled input signal comprises a digitally modulated communications signal and wherein the second clock rate is an integer multiple of a symbol rate of the digitally modulated communications signal.

15. The method of claim 11, further comprising preliminarily processing, prior to the processing, the band limited sampled signal with at least one intermediate processing stage.

16. The method of claim 11, wherein the processing comprises filtering with a finite impulse response filter, the finite impulse response filter adapted to exclude, in response to receiving the synchronization signals, the selected samples from the processing.

17. The method of claim 16, wherein the finite impulse response filter comprises a multiple tap delay line providing a plurality of scaled delay line tap outputs to a summer, the multiple tap delay line adapted to selectively withhold, in response to the synchronization signals, providing at least one delay line tap output to the summer.

18. A signal processing circuit, comprising:

at least one of a radio frequency receiver adapted to selectively receiving a radio frequency signal and producing a downconverted and conditioned signal and a radio frequency transmitter adapted to selectively generation a radio frequency signals for transmission;

an analog to digital converter, communicatively coupled to the radio frequency receiver, the analog to digital converter accepting the downconverted and conditioned signal and producing a sampled input signal sampled with a first clock rate, wherein the signal processing circuit uses less memory to implement fewer delay line stages when the input signal is processed by circuitry operating at a second clock rate than when the input signal is processed by circuitry operating at the first clock rate, the second clock rate being different from and fractionally related to the first clock rate;

a resampling filter, communicatively coupled to the analog to digital converter, the resampling filter accepting the sampled input signal, the resampling filter filtering the sampled input signal to remove spectral components above a spectral bandwidth of the second clock rate, the resampling filter producing a band limited sampled signal sampled at the first clock rate; and a discrete time processor operating with a clock rate that is an integer power of two multiple of the first clock rate, the discrete time processor communicatively coupled to the resampling filter to receive the band limited sampled signal, the discrete time processor adapted to process samples of the band limited sampled signal by excluding selected samples of the band limited sampled signal from the processing so as to effectively perform discrete time processing of the band limited sampled signal at the integer power of two multiple of the second clock rate.

19. The signal processing circuit of claim 18, including a subsequent discrete time processor, communicatively coupled to an output of the discrete time processor, the subsequent discrete time processor processing, at an integer power of two multiple of the first clock rate, samples produced at the output of the discrete time processor, the subsequent discrete time processor further excluding from the processing selected samples so as to effectively perform discrete time processing of the samples produced at the output of the discrete time processor at the integer power of two multiple of the second clock rate.

20. The signal processing circuit of claim 18, including a sampling frequency control algorithm controller, communicatively coupled to the radio frequency receiver, for providing synchronization signals that indicate occurrences of the selected samples.

* * * * *

UNITED STATES PATENT AND TRADEMARK OFFICE
CERTIFICATE OF CORRECTION

| | |
|---|---|
| PATENT NO. | : 7,782,991 B2 |
| APPLICATION NO. | : 11/621387 |
| DATED | : August 24, 2010 |
| INVENTOR(S) | : Charles LeRoy Sobchak et al. |

It is certified that error appears in the above-identified patent and that said Letters Patent is hereby corrected as shown below:

In Col. 14, line 5, claim 18

"generation a" should be changed to --generating--.

Signed and Sealed this

Seventeenth Day of May, 2011

David J. Kappos
*Director of the United States Patent and Trademark Office*